United States Patent [19]

Peek et al.

[11] 4,332,078
[45] Jun. 1, 1982

[54] METHOD OF MANUFACTURING A SEMICONDUCTOR DEVICE

[75] Inventors: Hermanus L. Peek, Eindhoven, Netherlands; Marnix G. Collet, Sunnyvale, Calif.

[73] Assignee: U.S. Philips Corporation, Tarrytown, N.Y.

[21] Appl. No.: 191,101

[22] Filed: Sep. 26, 1980

[30] Foreign Application Priority Data

Oct. 8, 1979 [NL] Netherlands .................. 7907434

[51] Int. Cl.³ ............................................. H01L 21/28
[52] U.S. Cl. ...................................... 29/580; 29/591; 148/187; 357/24
[58] Field of Search .................. 29/591, 580, 571; 148/187; 357/24

[56] References Cited

U.S. PATENT DOCUMENTS

| 3,909,925 | 10/1975 | Forbes | 29/591 X |
| 4,027,382 | 6/1977 | Tasch et al. | 29/589 X |
| 4,077,112 | 3/1978 | Theunissen et al. | 29/580 |
| 4,178,396 | 12/1979 | Okano et al. | 357/24 X |
| 4,288,256 | 9/1981 | Ning et al. | 148/187 X |

Primary Examiner—G. Ozaki
Attorney, Agent, or Firm—T. A. Briody; R. T. Mayer; R. J. Meetin

[57] ABSTRACT

In manufacturing a semiconductor device, a semiconductor body (2) is first provided with a first insulating layer (3,4) having a homogeneous dielectric thickness. A first conductor pattern (5) of polycrystalline silicon is then provided on the first insulating layer. A second insulating layer (6) is formed by oxidation of the first conductor pattern in such manner that the dielectric thickness of the first insulating layer remains approximately constant. Insulating paths (8) are then formed in spaces below edges (9) of the second insulating layer by successive deposition and etching steps. During the deposition step, a temporary layer is deposited to a thickness exceeding half the height of the spaces. During the etching step, the temporary layer is removed from the second insulating layer. Finally, a second conductor pattern (7) is provided on and beside the second insulating layer.

10 Claims, 3 Drawing Figures

METHOD OF MANUFACTURING A SEMICONDUCTOR DEVICE

BACKGROUND OF THE INVENTION

1. Field of the Invention

The invention relates to a method of manufacturing a semiconductor device in which a surface of a semiconductor body is provided with a first insulating layer having a dielectric thickness which is homogeneous throughout the surface, on which a first conductor pattern of polycrystalline silicon is provided, on which first conductor pattern a second insulating layer is formed by oxidation of said pattern in such manner that the dielectric thickness of the first insulating layer remains approximately constant, after which a second conductor pattern is provided on and beside the second insulating layer.

"Approximately constant" is to be understood to mean herein that, as a result of treatments in connection with the oxidation of the first conductor pattern, the dielectric thickness at the area of the first insulating layer may deviate at most ±50% from the original value.

2. Description of the Prior Art

Such a method is disclosed in U.S. Pat. No. 4,077,112.

In this method a silicon semiconductor body is provided with a first insulating layer which consists of a silicon dioxide layer and a silicon nitride layer.

After providing the first conductor pattern and forming the second insulating layer the silicon nitride layer beside the first conductor pattern is removed and the thickness of the silicon dioxide layer beside the first conductor pattern is increased by oxidation so that the dielectric thickness at the area of the first insulating layer remains constant.

It has been found that during oxidation of a conductor pattern provided on a first insulating layer the resulting second insulating layer may have a rounded shape at the edges of the pattern near the first insulating layer so that spaces are formed below the edges of the second insulating layer.

This results in a number of problems which can detrimentally influence the desired operation of the semiconductor device to be manufactured.

If, for example, the second conductor pattern consists of polycrystalline silicon, the spaces between the insulating layers are also filled when said material is provided in the usual manners.

During the formation of the second conductor pattern from the provided material the polycrystalline silicon is often not removed from the spaces. As a result of this, parts of the second conductor pattern which overlap parts of the first conductor pattern can be short-circuited via a polycrystalline wire formed in the spaces between the insulating layers.

Indeed, when the polycrystalline silicon is removed from the spaces, the possibility exists that upon providing a subsequent insulating layer, for example, of silicon oxide, a bad step coating is obtained at the area of the spaces.

A bad step coating is therefore obtained if a third conductor pattern, for example of aluminium, is provided on the said subsequent insulating layer. This third pattern may then even show interruptions.

Furthermore, the distance between two overlapping parts of polysilicon conductor patterns at the area of the spaces is minimum and an increase in density of field lines takes place there due to the tapered nature of the spaces so that the breakdown voltage between the overlapping parts is decreased.

If the second conductor pattern consists of aluminium, the spaces between the insulating layers during its provision are not filled and the step coating at the area of said spaces is bad so that the second conductor pattern may show interruptions.

At the area where the second conductor pattern is not present, a subsequent insulating layer, if any, and a third conductor pattern above the spaces may show serious defects.

SUMMARY OF THE INVENTION

One of the objects of the invention is to avoid the foregoing problems at least to a considerable extent.

The invention is based inter alia on the recognition of the fact that the formation of hollow spaces or spaces filled with conductive material between the insulating layers is to be prevented.

Therefore, according to the invention, the method mentioned in the opening paragraph is characterized in that insulating paths are formed between the formation of the second insulating layer and the provision of the second conductor pattern while avoiding an alignment step and while using successive deposition and etching steps, which paths fill substantially only spaces below edges of the second insulating layer, during which deposition step a temporary layer is deposited to a thickness exceeding half the height of the space and during which etching step the temporary layer is removed from the second insulating layer.

The method according to the invention permits the avoidance of short circuit phenomena and conductor interruptions.

The deposition step is preferably carried out from a gaseous phase at reduced pressure. In such circumstances the rate at which the deposition step occurs is little or not determined by diffusion in the gaseous phase and a complete filling of the spaces is achieved more easily.

The thickness of the layer deposited during the deposition step need not be much larger than half the height of the spaces. This is associated with the fact that in the spaces the surfaces as it were grow towards each other so that the spaces are filled if the thickness of the deposited layer is equal to half the height of the spaces.

In a preferred embodiment of the invention a third insulating layer is provided during the deposition step on, beside and below the edges of the second insulating layer, from which third insulating layer the insulating paths are obtained by etching.

The third insulating layer preferably consists of silicon nitride, silicon dioxide, silicon oxynitride or aluminium oxide.

In another embodiment of the invention a polycrystalline silicon layer is grown during the deposition step on, beside and below the edges of the second insulating layer, from which polycrystalline layer polycrystalline paths can be obtained in the spaces by etching, after which the polycrystalline paths are converted into oxide paths.

The formation of the spaces below the edges of the second insulating layer depends inter alia on the composition of the first insulating layer.

The first insulating layer preferably consists of silicon dioxide which is obtained by oxidation of the semiconductor body.

After providing the first conductor pattern exposed parts of the first insulating layer are removed and the first conductor pattern and exposed parts of the semiconductor surface are subjected to an oxidation treatment so as to obtain the second insulating layer on the first conductor pattern and to replace the removed parts of the first insulating layer until the original thickness of the first insulating layer is approximately restored, after which the insulating paths are formed.

The first insulating layer may also consist of several sub-layers; for example, the first insulating layer preferably consists of two sub-layers the former of which consists of silicon dioxide and the latter of which consists of silicon nitride. Various possibilities are available.

For example, in a modified embodiment of the method in accordance with the invention, exposed parts of the sub-layer of silicon nitride are removed after the formation of the second insulating layer and the semiconductor body is subjected to an oxidation treatment until the original dielectric thickness of the first insulating layer is approximately restored, after which the insulating paths are formed.

In another modified embodiment of the method in accordance with the invention the insulating paths filling the spaces below the edges of the second insulating layer are formed on parts of the surface of the sublayer of silicon nitride and on parts of the surface of the second insulating layer adjoining said parts after the formation of the second insulating layer.

BRIEF DESCRIPTION OF THE DRAWING

The invention will now be illustrated with reference to three embodiments and the accompanying drawing.

DESCRIPTION OF THE PREFERRED EMBODIMENTS

Figure 1:
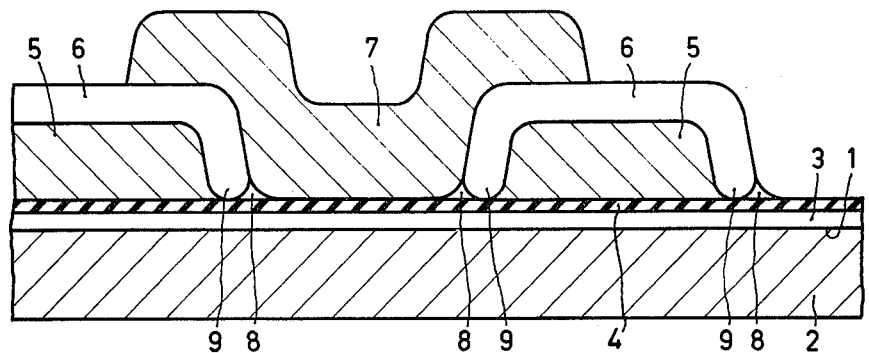
FIG. 1 in the drawing is a diagrammatic part of a sectional view of a first semiconductor device in a stage of manufacture by means of the method according to the invention.

With the examples, the invention is illustrated with reference to the manufacture of charge transfer devices (see FIG. 1).

A surface 1 of a semiconductor body 2 is provided with a first insulating layer 3, 4 having a dielectric thickness which is homogeneous throughout its surface on which a first conductor pattern 5 of polycrystalline silicon is provided.

A second insulating layer 6 is formed on said first conductor pattern by oxidation of said pattern, the dielectric thickness of the first insulating layer 3, 4 remaining approximately constant.

A second conductor pattern 7 is then provided on and beside the second insulating layer 6.

According to the invention, paths 8 are formed between the formation of the second insulating layer 6 and the provision of the second conductor pattern 7 while avoiding an alignment step and while using successive deposition and etching steps, which paths substantially fill only spaces below edges 9 of the second insulating layer 6. For that purpose, a temporary layer is deposited during the deposition step in a thickness exceeding half the height of the space and during the etching step the temporary layer is removed from the second insulating layer 6.

Starting material is a p-type silicon wafer 2 on a surface 1 of which a first 0.08 $\mu$m thick sub-layer 3 of silicon dioxide and a second 0.04 $\mu$m thick sub-layer 4 of silicon nitride are deposited in a usual manner, the sub-layers 3 and 4 together constituting the first insulating layer 3, 4.

The conductor pattern 5 of polycrystalline silicon is then formed in a usual manner and the second insulating layer 6 is formed by oxidation of said pattern. The first insulating layer 3, 4 does not substantially vary in thickness or composition so that the dielectric thickness of said layer remains constant.

It has been found that during the formation of the second insulating layer 6 spaces are formed below edges 9 of said layer which adjoin edges of exposed parts of the first insulating layer 3, 4.

In the subsequent deposition step, using known techniques, a 0.08 $\mu$m thick third insulating layer of silicon nitride is deposited on, beside and below the edges 9 of the second insulating layer 6 from a gaseous phase containing silane and ammonia under reduced pressure. The thickness of said layer is well over half the height of the spaces which is 0.1 $\mu$m.

This third insulating layer is then removed by etching until the nitride on the second insulating layer has disappeared and while leaving insulating paths 8 which fill substantially only spaces below edges 9 of the second insulating layer 6.

In this example the insulating paths 8 are situated on parts of the surface of the sub-layer 4 of silicon nitride and on areas of the surface of the second insulating layer 6 adjoining said parts.

The second conductor pattern 7 of, for example, aluminum or polysilicon is then provided and further insulating layers and conductor patterns may be formed.

A good step coating of the layers, absence of short-circuit between the conductor patterns and absence of interruptions in the conductor patterns were found.

Figure 2:
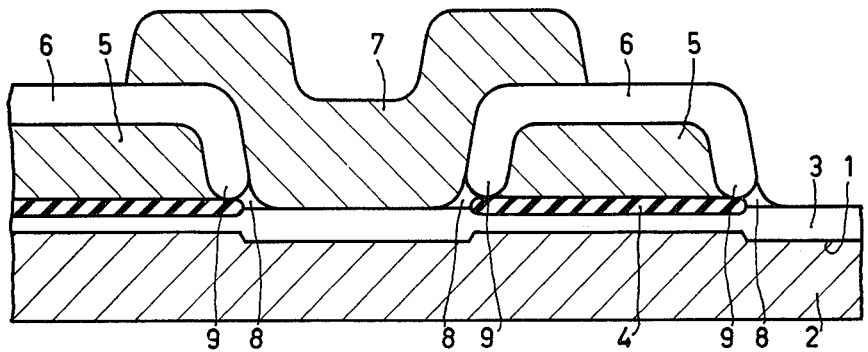
FIG. 2 is a diagrammatic sectional view of a part of a second semiconductor device in a stage of manufacture by means of the method according to the invention.

It may be desirable to remove, after the formation of the second insulating layer 6, exposed parts of the sub-layer 4 of silicon nitride (see FIG. 2). The semiconductor body is then subjected to an oxidation treatment until the original dielectric thickness of the first insulating layer is approximately restored.

During this oxidation treatment the thickness of the exposed parts of the sub-layer 3 of silicon dioxide increases by 0.02 $\mu$m.

The third insulating layer may again consist of silicon nitride and be etched until the nitride on the second insulating layer has disappeared while leaving the insulating paths.

Figure 3:
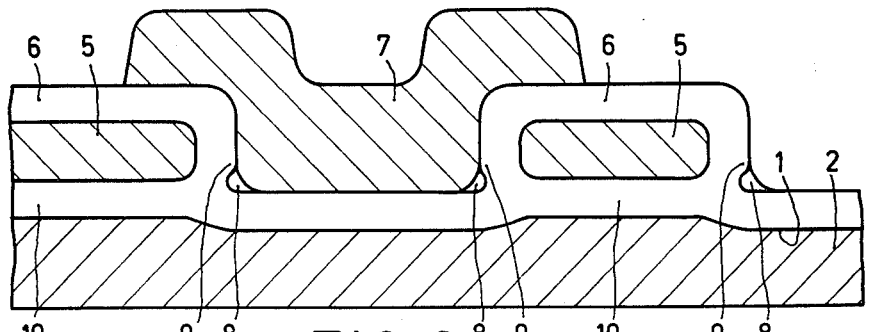
FIG. 3 is a diagrammatic sectional view of a part of a third semiconductor device in a stage of manufacture by means of the method according to the invention.

The first insulating layer (see FIG. 3) may may be a layer 10 consisting of silicon dioxide only. After providing the first conductor pattern 5, exposed parts of the first insulating layer 10 are removed and the first conductor pattern 5 and exposed parts of the semiconductor surface 1 are subjected to an oxidation treatment so as to obtain the second insulating layer 6 on the first conductor pattern 5 and to replace the removed parts of the first insulating layer 10.

This treatment is continued until the original thickness of the first insulating layer 10 over the whole surface is approximately restored.

As described above, a third insulating layer of silicon nitride may then be deposited from the gaseous phase, the insulating paths being obtained.

The invention is not restricted to the examples described but many variations are possible to those skilled in the art without departing from the scope of this invention.

Instead of silicon nitride, the spaces may also be filled with silicon dioxide, silicon oxynitride or aluminium oxide which may also be deposited in the usual manner from a vapour phase.

For example, in the first described case in which a sub-layer 4 of silicon nitride is permanently present, a polycrystalline silicon layer may be grown in the deposition step on, beside and below the edges 9 of the second insulating layer 6, which polycrystalline silicon layer is removed by etching of the second insulating layer 6 of silicon dioxide and the second sub-layer 4 of silicon nitride while leaving polycrystalline silicon paths in the spaces. The polycrystalline paths are converted into oxide paths 8 by an oxidation treatment.

Nor is the invention restricted to the manufacture of charge transfer devices but it may generally be used when spaces are formed by oxidation of polysilicon tracks.

What is claimed is:

1. A method of manufacturing a semiconductor device in which a surface of a semiconductor body is provided with a first insulating layer having a dielectric thickness which is homogeneous throughout the surface, on which a first conductor pattern of polycrystalline silicon is provided, on which first conductor pattern a second insulating layer is formed by oxidation of said pattern in such manner that the dielectric thickness of the first insulating layer remains approximately constant, after which a second conductor pattern is provided on and beside the second insulating layer, characterized in that insulating paths are formed between the formation of the second insulating layer and the provision of the second conductor pattern while avoiding an alignment step and while using successive deposition and etching steps, which paths fill substantially only spaces below edges of the second insulating layer, during which deposition step a temporary layer is deposited to a thickness exceeding half the height of the space and during which etching step the temporary layer is removed from the second insulating layer.

2. A method as claimed in claim 1, characterized in that the deposition step is carried out from a gaseous phase at reduced pressure.

3. A method as claimed in claim 1 or 2, characterized in that a third insulating layer is provided during the deposition step on, beside and below the edges of the second insulating layer, from which third insulating layer the insulating paths are obtained by etching.

4. A method as claimed in claim 3, characterized in that the material of the third insulating layer is selected from the group consisting of silicon nitride, silicon dioxide, silicon oxynitride and aluminium oxide.

5. A method as claimed in claim 1 or 2, characterized in that a polycrystalline silicon layer is grown during the deposition step on, beside and below the edges of the second insulating layer, from which polycrystalline layer polycrystalline paths are obtained in the spaces by etching, after which the polycrystalline paths are converted into oxide to form the insulating paths.

6. A method as claimed in claim 3, characterized in that the first insulating layer consists of silicon dioxide and is obtained by oxidation of the semiconductor body.

7. A method as claimed in claim 6, characterized in that after providing the first conductor pattern exposed parts of the first insulating layer are removed and the first conductor pattern and exposed parts of the surface of the semiconductor body are subjected to an oxidation treatment so as to obtain the second insulating layer on the first conductor pattern and to replace the removed parts of the first insulating layer until the original thickness of the first insulating layer is approximately restored, after which the insulating paths are formed.

8. A method as claimed in claim 3, characterized in that the first insulating layer comprises a lower sub-layer of silicon dioxide and an upper sub-layer of silicon nitride.

9. A method as claimed in claim 8, characterized in that after the formation of the second insulating layer exposed parts of the sub-layer of silicon nitride are removed and the semiconductor body is subjected to an oxidation treatment until the original dielectric thickness of the first insulating layer is approximately restored, after which the insulating paths are formed.

10. A method as claimed in claim 8, characterized in that after the formation of the second insulating layer the insulating paths filling the spaces below the edges of the second insulating layer are formed on parts of the surface of the sub-layer of silicon nitride and on areas of the surface of the second insulating layer adjoining said parts.

* * * * *